United States Patent
Wang et al.

(10) Patent No.: US 8,642,414 B2
(45) Date of Patent: Feb. 4, 2014

(54) MOS TRANSISTOR STRUCTURE WITH IN-SITU DOPED SOURCE AND DRAIN AND METHOD FOR FORMING THE SAME

(75) Inventors: Jing Wang, Beijing (CN); Lei Guo, Beijing (CN); Jun Xu, Beijing (CN)

(73) Assignee: Tsinghua University (CN)

( * ) Notice: Subject to any disclaimer, the term of this patent is extended or adjusted under 35 U.S.C. 154(b) by 0 days.

(21) Appl. No.: 13/132,768

(22) PCT Filed: Jan. 19, 2011

(86) PCT No.: PCT/CN2011/070392
§ 371 (c)(1),
(2), (4) Date: Jun. 3, 2011

(87) PCT Pub. No.: WO2011/143942
PCT Pub. Date: Nov. 24, 2011

(65) Prior Publication Data
US 2012/0032231 A1    Feb. 9, 2012

(30) Foreign Application Priority Data

May 20, 2010    (CN) .......................... 2010 1 0177623

(51) Int. Cl.
*H01L 21/336* (2006.01)
(52) U.S. Cl.
USPC ........................... 438/197; 438/285; 438/300

(58) Field of Classification Search
USPC ................. 438/197, 198, 285, 300, 305, 602; 257/E21.409
See application file for complete search history.

(56) References Cited

U.S. PATENT DOCUMENTS

| | | | |
|---|---|---|---|
| 7,368,358 B2 * | 5/2008 | Ouyang et al. ................ 438/299 |
| 2007/0254421 A1 * | 11/2007 | Tsai et al. ..................... 438/197 |
| 2008/0006818 A1 * | 1/2008 | Luo et al. ......................... 257/19 |
| 2008/0076236 A1 * | 3/2008 | Chiang et al. ................. 438/509 |

* cited by examiner

*Primary Examiner* — Michael Trinh
(74) *Attorney, Agent, or Firm* — Lerner, David, Littenberg, Krumholz & Mentlik, LLP

(57) ABSTRACT

A MOS transistor structure with an in-situ doped source and/or drain and a method for forming the same are provided. The method comprises steps of: providing a substrate; forming a high Ge content layer on the substrate; forming a gate stack on the high Ge content layer and forming a side wall of one or more layers on both sides of the gate stack; etching the high Ge content layer to form a source region and/or a drain region; and forming a source and/or a drain in the source region and/or the drain region respectively by a low-temperature selective epitaxy, and introducing a doping gas during the low-temperature selective epitaxy to heavily dope the source and/or the drain and to in-situ activate a doping element.

10 Claims, 6 Drawing Sheets

MOS TRANSISTOR STRUCTURE WITH IN-SITU DOPED SOURCE AND DRAIN AND METHOD FOR FORMING THE SAME

CROSS-REFERENCE TO RELATED APPLICATIONS

The present application is a national phase entry under 35 U.S.C. §371 of International Application No. PCT/CN2011/070392, filed Jan. 19, 2011, which claims the benefit of Chinese Patent Application No. 201010177623.8, filed May 20, 2010, the entire disclosures of which applications are incorporated herein by reference.

FIELD

The present disclosure relates to a semiconductor fabrication and design field, and more particularly to a MOS transistor structure with an in-situ doped source and/or drain and a method for forming the same.

BACKGROUND

With a continuous scaling down of a field-effect transistor feature size, a working speed thereof is faster and faster. However, a feature size of the field-effect transistor has reached a physical limit thereof, and therefore it will become more and more difficult to improve the working speed of the field-effect transistor by reducing the feature size thereof. Therefore, there is a need for other methods for improving the speed of a device, for example, Ge or a SiGe material with high Ge content is used as a channel material to increase a mobility of carriers. However, because the Ge or the SiGe material with high Ge content is unstable at high temperature and doping elements such as As, P and B in a Ge layer or a SiGe layer with high Ge content are very difficult to be activated, how to form an activated heavily-doped source and/or drain in the Ge layer or the SiGe layer with high Ge content has become a focus.

SUMMARY

The present disclosure is aimed to solve at least one of the above mentioned technical problems, particularly a defect of being difficult to form an activated heavily-doped source and/or drain in a Ge layer or a SiGe layer with high Ge content.

According to an aspect of the present disclosure, a MOS transistor structure with an in-situ doped source and/or drain is provided, comprising: a substrate; a high Ge content layer formed on the substrate; a gate stack formed on the high Ge content layer and a side wall of one or more layers formed on both sides of the gate stack; and a source and a drain formed in the high Ge content layer, wherein the source and/or the drain are formed by a low-temperature selective epitaxy, and a doping gas is introduced during the low-temperature selective epitaxy to heavily dope the source and/or the drain and to in-situ activate a doping element.

According to another aspect of the present disclosure, a method for forming a MOS transistor structure with an in-situ doped source and/or drain is provided, comprising steps of: providing a substrate; forming a high Ge content layer on the substrate; forming a gate stack on the high Ge content layer and forming a side wall of one or more layers on both sides of the gate stack; etching the high Ge content layer to form a source region and/or a drain region; and forming a source and/or a drain in the source region and/or the drain region respectively by a low-temperature selective epitaxy, and introducing a doping gas during the low-temperature selective epitaxy to heavily dope the source and/or the drain and to in-situ activate a doping element.

According to an embodiment of the present disclosure, the source and/or the drain may be respectively formed in the high Ge content layer by the low-temperature selective epitaxy, and the doping gas with a high flow rate is introduced during the low-temperature selective epitaxy to introduce doping elements so as to heavily dope the source and/or the drain and to in-situ activate the doping elements, thus forming an activated heavily-doped source and/or an activated heavily-doped drain in the Ge layer or in the SiGe layer with high Ge content.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION OF EMBODIMENTS OF THE DISCLOSURE

Figure 1:
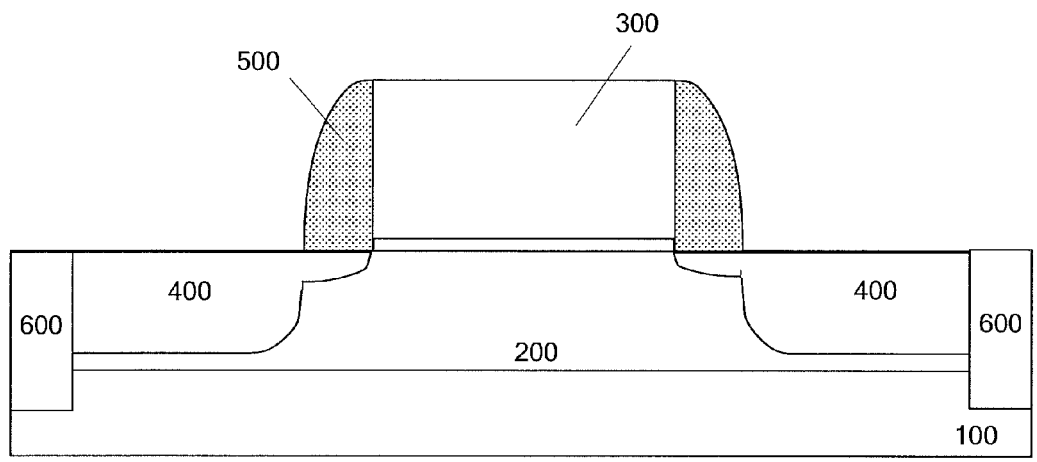
FIG. 1 is a cross-sectional view of a MOS transistor structure with an in-situ doped source and drain according to a first embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

FIG. 1 is a cross-sectional view of a MOS transistor structure with an in-situ doped source and drain according to a first embodiment of the present disclosure. The MOS transistor structure comprises: a substrate 100; a layer 200 with high Ge content, for example, a strained or non-strained Ge layer or a strained or non-strained SiGe layer with high Ge content, formed on the substrate 100; and an isolation structure 600 for isolating the MOS transistor structure. The substrate 100 may be of any semiconductor material, including, but not limited to, silicon, germanium, silicon germanide, SOI (silicon on insulator), silicon carbide, gallium arsenide, or any Group III/V compound. In one embodiment, the isolation structure 600 may comprise a field oxide isolation structure or a STI (shallow trench isolation) structure. In addition, it would be appreciated by those skilled in the art that a depth of the isolation structure 600 in the drawings is merely exemplary and may be adjusted according to particular requirements of the MOS transistor structure, which should also fall within the scope of the present disclosure.

The MOS transistor structure also comprises a gate stack 300 formed on the layer 200 with high Ge content and a side wall 500 of one or more layers formed on both sides of the gate stack 300; and a source 400 and a drain 400 formed respectively in the layer 200 with high Ge content. In some embodiments, the source 400 and the drain 400 are formed by a low-temperature selective epitaxy, and during the low-temperature selective epitaxy, a doping gas is introduced to heavily dope the source 400 and the drain 400 and to in-situ activate a doping element. In one embodiment, the gate stack 300 may comprise a gate dielectric layer and a gate, and preferably may comprise a high-k gate dielectric layer and a metal gate. Certainly, a dielectric layer of other nitrides or oxides, and a polysilicon gate may also be used, which should also fall within the scope of the present disclosure. In other embodiments, the gate stack 300 may also comprise layers of other material to improve certain other characteristics of the gate. It may be seen that there are no special limits on a structure of the gate stack, and any type gate structure may be used.

Figure 2:
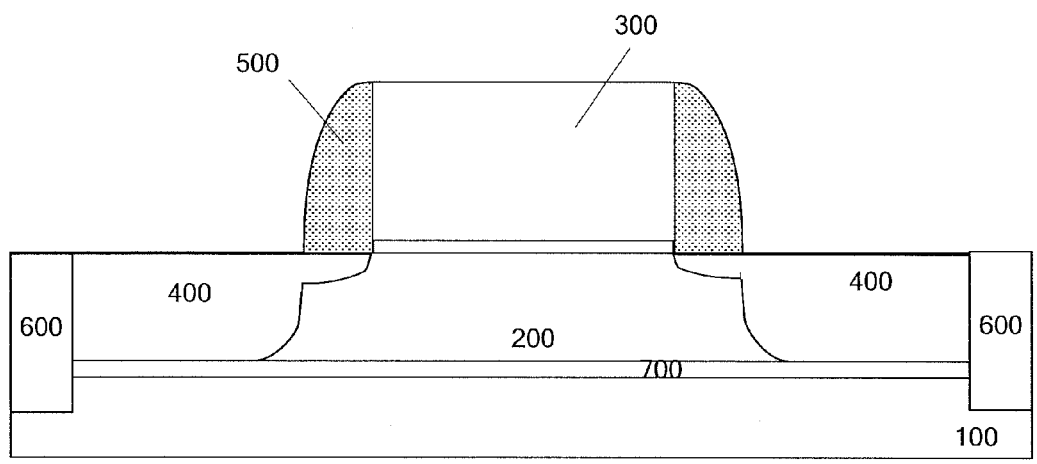
FIG. 2 is a cross-sectional view of a MOS transistor structure with an in-situ doped source and drain according to a second embodiment of the present disclosure.
Figure 3:
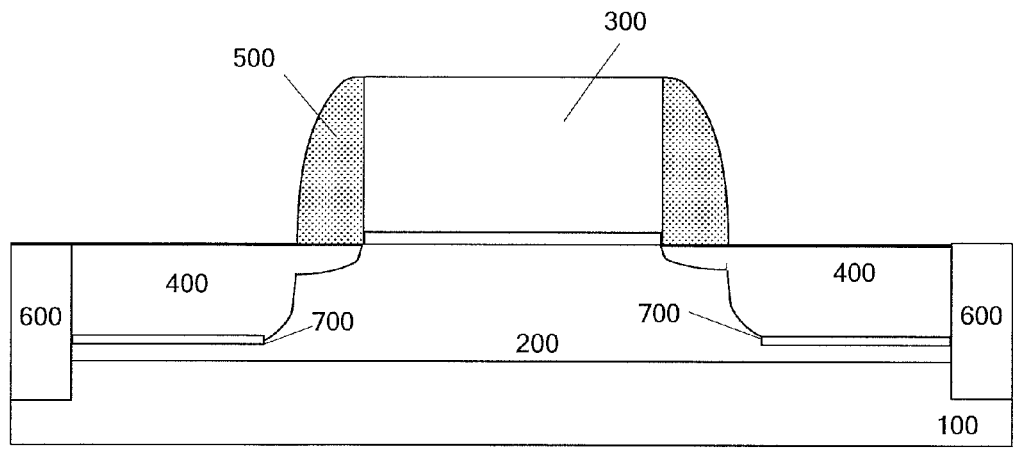
FIG. 3 is a cross-sectional view of a MOS transistor structure with an in-situ doped source and drain according to a third embodiment of the present disclosure.

In some embodiments, in order to alleviate a BTBT (Band-to-Band Tunneling) leakage in the source and in the drain, a Si substrate may be used, or the MOS transistor structure further comprises a strained Si layer or a strained SiGe layer with low Ge content 700 formed below the source 400 and the drain 400 and on the substrate 100. In one embodiment, as shown in FIG. 2, the strained Si layer or the strained SiGe layer with low Ge content 700 is formed between the substrate 100 and the layer 200 with high Ge content. In another embodiment, as shown in FIG. 3, the strained Si layer or the strained SiGe layer with low Ge content 700 is only formed below the source 400 and the drain 400.

Figure 4:
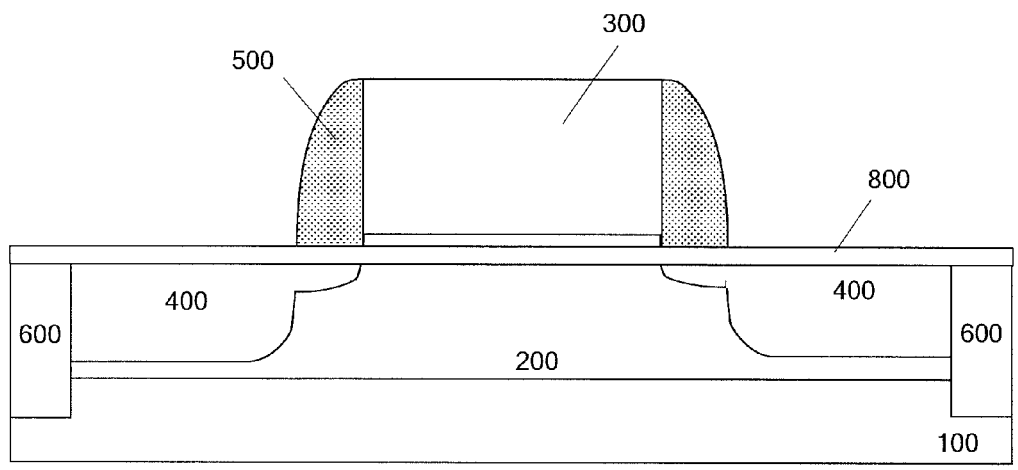
FIG. 4 is a cross-sectional view of a MOS transistor structure with an in-situ doped source and drain according to a fourth embodiment of the present disclosure.

In one embodiment, in order to alleviate a GIDL (gate induced drain leakage), the MOS transistor structure with an in-situ doped source and drain also comprises a strained Si layer or a strained SiGe layer with low Ge content 800 formed on the layer 200 with high Ge content, as shown in FIG. 4. It should be noted that the strained Si layer or the strained SiGe layer with low Ge content 800 in this embodiment may also be applied in the MOS transistor structure in the embodiment shown in FIG. 2 or 3 to form a Si—Ge—Si structure, thus effectively alleviating problems of the BTBT leakage and interface states between the gate dielectric layer and a channel layer.

In order to better understand the MOS transistor structure according to an embodiment of the present disclosure, a method for forming the MOS transistor structure described above is also provided. It should be noted that the MOS transistor structure may be fabricated through various technologies, such as different types of product lines or different processes. However, if the MOS transistor structures fabricated through various technologies have substantially the same structure and technical effects as those of the present disclosure, they should be within the scope of the present disclosure. In order to better understand the present disclosure, the method for forming the MOS transistor structure of the present disclosure described above will be described in detail below. Moreover, it should be noted that the following steps are described only for exemplary and/or illustration purpose rather than for limitations. Other technologies may be adopted by those skilled in the art to form the semiconductor structure of the present disclosure described above.

Embodiment 1

Figure 5:
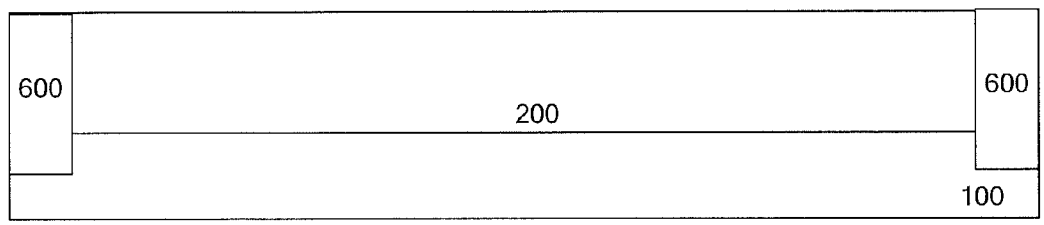
FIGS. 5-7 are cross-sectional diagrams of intermediate statuses of a MOS transistor structure with an in-situ doped source and drain formed during a process of a method for forming the MOS transistor structure according to a first embodiment of the present disclosure.
Figure 6:
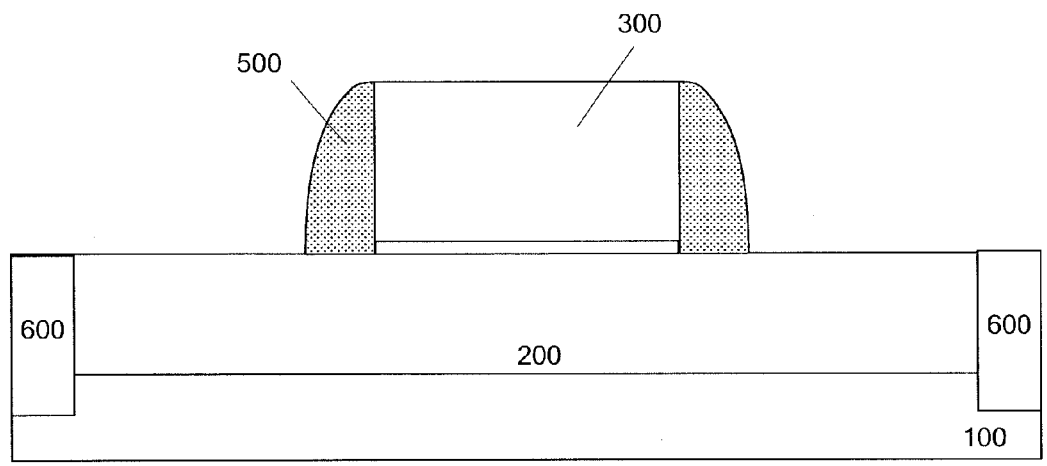
Figure 7:
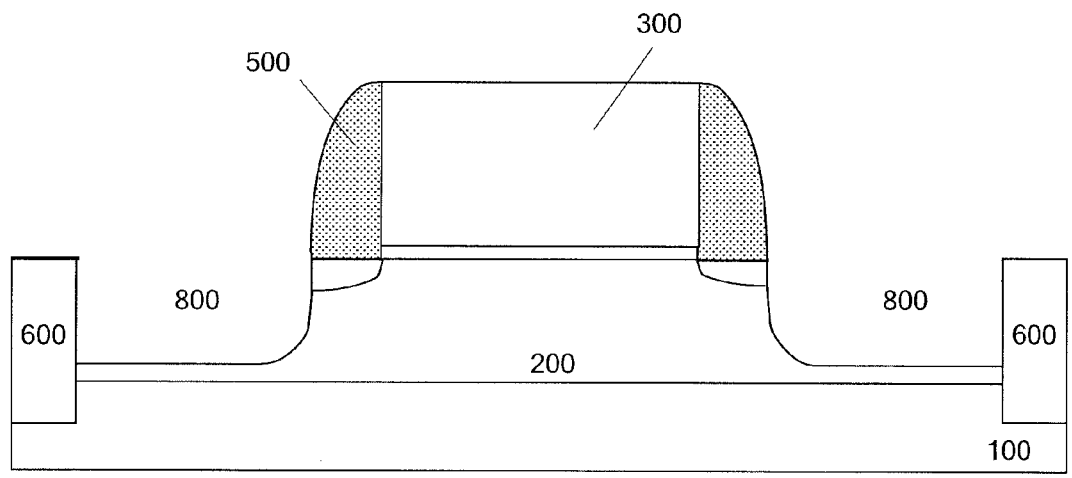

FIGS. 5-7 are cross-sectional diagrams of intermediate statuses of a MOS transistor structure with an in-situ doped source and drain formed during a process of a method for forming the MOS transistor structure according to a first embodiment of the present disclosure. The method comprises the following steps.

Step S101, a substrate 100 is provided. In some embodiments, various materials described above may be used to form the substrate 100.

Step S102, a layer 200 with high Ge content is formed on the substrate 100, and an isolation structure 600 for isolating the MOS transistor structure is formed, as shown in FIG. 5. In some embodiments, the isolation structure 600 may comprise a field oxide isolation structure or a STI (shallow trench isolation) structure.

Step S103, a gate stack 300 is formed on the layer 200 with high Ge content, and a side wall 500 of one or more layers is formed on both sides of the gate stack 300, as shown in FIG. 6. In one embodiment, after the gate stack 300 is formed, LDD implanting may also be performed.

Step S104, parts of the layer 200 with high Ge content which are on both sides of the gate stack 300 are etched to form a source region 800 and a drain region 800 respectively, as shown in FIG. 7. In some embodiments, the source region 800 and the drain region 800 formed by etching may be of any possible shape, for example, a shape shown in FIG. 7 or a diamond shape.

Step S105, a source 400 and a drain 400 are formed in the source region 800 and the drain region 800 respectively by a low-temperature selective epitaxy, and during the low-temperature selective epitaxy, a doping gas is introduced to heavily dope the source 400 and the drain 400 and to in-situ activate a doping element, as shown in FIG. 1. In one embodiment, the source 400 and the drain 400 may be formed in the source region 800 and the drain region 800 respectively by a RPCVD (low-temperature reduced pressure chemical vapor deposition) and a selective epitaxy, in one embodiment, at a temperature ranging between about 300° C. and about 600° C. In another embodiment, the source 400 and the drain 400 may be formed in the source region 800 and the drain region 800 respectively by a UHVCVD (ultra-high vacuum chemical vapor deposition) and a selective epitaxy, in one embodiment, at a temperature ranging between about 200° C. and about 600° C. It should be noted that, in this embodiment, RPCVD and UHVCVD are described only as an example, and other low-temperature CVD processes or similar processes may also be used, which should also fall within the scope of the present disclosure.

In one embodiment, a precursor for epitaxy may comprise $GeH_4$ or a gas mixture of $SiH_4$ and $GeH_4$. For example, if a strained Ge layer needs to be formed, $GeH_4$ may be used as the precursor for epitaxy. If a SiGe layer with high Ge content is to be formed, a ratio of $SiH_4$ to $GeH_4$ may be adjusted to control a content of Ge in the SiGe layer. In some embodiments, the content of Ge in the SiGe layer with high Ge content is larger than 50%. In some embodiments, during the epitaxy, doping gases such as $AsH_3$, $PH_3$ or $BH_3$ may be introduced. Certainly, it would be appreciated by those skilled in the art that, for different precursors for epitaxy, other doping gases may also be used. However, without departing from the spirit of the present disclosure, the other doping gases should fall within the scope of the present disclosure. Flow rates of the precursor for epitaxy and the doping gas are related with the technology and the temperature. For different temperatures and different technologies, the flow rates of the precursor for epitaxy and the doping gas may be changed, which should fall within the scope of the present disclosure.

According to an embodiment of the present disclosure, the doping gas with high flow rate is introduced during the epitaxial growth, so that dopant atoms in the formed source 400 and the formed drain 400 may be at right positions in a lattice. In this way, the formed source 400 and the formed drain 400 are activated themselves, without needing a high temperature annealing to activate the dopant atoms in subsequent steps. Therefore, not only activation rates of the source 400 and the drain 400 may be ensured, but also an influence of a subsequent high temperature technology on the layer 200 with high Ge content may be avoided, thus forming an activated heavily-doped source and an activated heavily-doped drain in the Ge layer or in the SiGe layer with high Ge content.

Embodiment 2

FIGS. 8-11 are cross-sectional diagrams of intermediate statuses of a MOS transistor structure with an in-situ doped source and drain formed during a process of a method for forming the MOS transistor structure according to a second embodiment of the present disclosure. The method comprises the following steps.

Step S201, a substrate 100 is provided.

Figure 8:
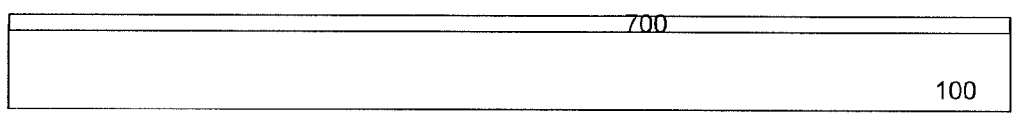
FIGS. 8-11 are cross-sectional diagrams of intermediate statuses of a MOS transistor structure with an in-situ doped source and drain formed during a process of a method for forming the MOS transistor structure according to a second embodiment of the present disclosure.

Step S202, a strained Si layer or a strained SiGe layer with low Ge content 700 is formed on the substrate 100 to alleviate a BTBT leakage in the source and in the drain, as shown in FIG. 8.

Figure 9:
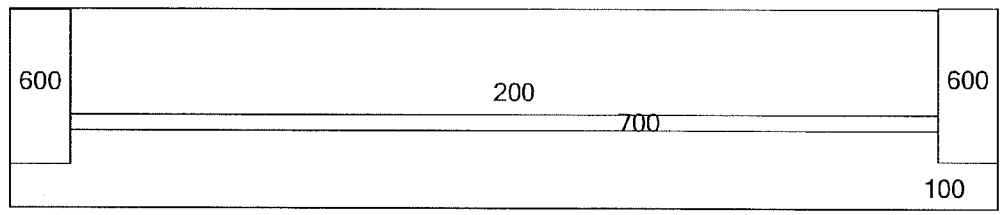

Step S203, a layer 200 with high Ge content is formed on the strained Si layer or the strained SiGe layer with low Ge content 700, and an isolation structure 600 for isolating the MOS transistor structure is formed, as shown in FIG. 9.

Figure 10:
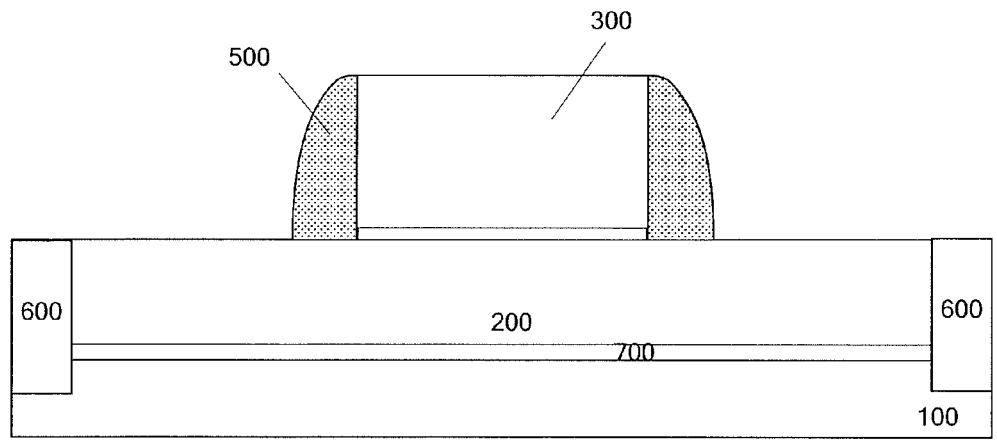

Step S204, a gate stack 300 is formed on the layer 200 with high Ge content, and a side wall 500 of one or more layers is formed on both sides of the gate stack 300, as shown in FIG. 10.

Figure 11:
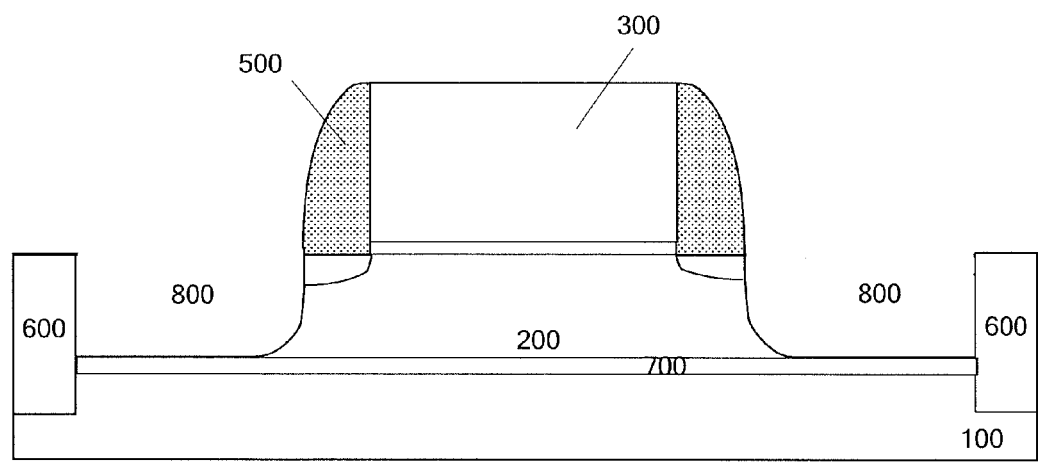

Step S205, parts of the layer 200 with high Ge content which are on both sides of the gate stack 300 are etched by using the strained Si layer or the strained SiGe layer with low Ge content 700 as a stop layer to form a source region 800 and a drain region 800 respectively, as shown in FIG. 11.

Step S206, a source 400 and a drain 400 are formed in the source region 800 and the drain region 800 respectively by a low-temperature selective epitaxy, and during the low-temperature selective epitaxy, a doping gas is introduced to heavily dope the source 400 and the drain 400 and to in-situ activate a doping element, as shown in FIG. 2. Conditions for forming the source 400 and the drain 400 are substantially the same as those described in Step S105, so a detailed description thereof will be omitted here.

Embodiment 3

Figure 12:
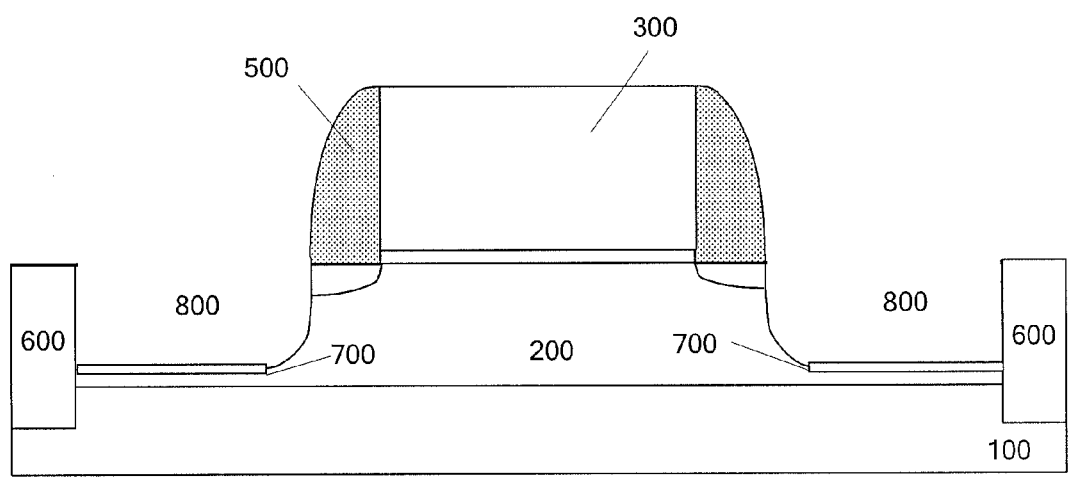
FIG. 12 is a cross-sectional diagram of an intermediate status of a MOS transistor structure with an in-situ doped source and drain formed during a process of a method for forming the MOS transistor structure according to a third embodiment of the present disclosure.

FIG. 12 is a cross-sectional diagram of an intermediate status of a MOS transistor structure with an in-situ doped source and drain formed during a process of a method for forming the MOS transistor structure according to a third embodiment of the present disclosure. The method comprises the following steps.

Step S301, a substrate 100 is provided.

Step S302, a layer 200 with high Ge content is formed on the substrate 100, and an isolation structure 600 for isolating the MOS transistor structure is formed.

Step S303, a gate stack 300 is formed on the layer 200 with high Ge content, and a side wall 500 of one or more layers is formed on both sides of the gate stack 300.

Step S304, parts of the layer 200 with high Ge content which are on both sides of the gate stack 300 are etched to form a source region 800 and a drain region 800 respectively.

Step S305, a strained Si layer or a strained SiGe layer with low Ge content 700 is at least formed on bottoms of the source region 800 and the drain region 800, as shown in FIG. 12.

Step S306, a source 400 and a drain 400 are formed in the source region 800 and the drain region 800 respectively by a low-temperature selective epitaxy, and during the low-temperature selective epitaxy, a doping gas is introduced to heavily dope the source 400 and the drain 400 and to in-situ activate a doping element, as shown in FIG. 3. Conditions for forming the source 400 and the drain 400 are substantially the same as those described in Step S105, so a detailed description thereof will be omitted here.

Embodiment 4

In some embodiments, a strained Si layer or a strained SiGe layer with low Ge content may also be formed on the source 400 and the drain 400 as well as on a channel layer. The method for forming the MOS transistor structure according to this embodiment will be described in connection with Embodiment 1. After the layer 200 with high Ge content is formed, a first strained Si layer or a first strained SiGe layer with low Ge content is formed on the layer 200 with high Ge content; and when the layer 200 with high Ge content is etched to form the source region 800 and the drain region 800, the first strained Si layer or the first strained SiGe layer with low Ge content is etched. Then, after the source 400 and the drain 400 are formed in the source region and the drain region respectively by the low-temperature selective epitaxy, a second strained Si layer or a second strained SiGe layer with low Ge content is formed on the source 400 and the drain 400 respectively to form a Si—Ge—Si structure. Therefore, with the method according to an embodiment of the present disclosure, problems of the BTBT leakage, GIDL and the interface states between the gate dielectric layer and the channel layer may be effectively alleviated.

According to an embodiment of the present disclosure, the source and the drain may be respectively formed in the high Ge content layer by the low-temperature selective epitaxy, and the doping gas with high flow rate is introduced during the low-temperature selective epitaxy to introduce doping elements so as to heavily dope the source and the drain and to in-situ activate the doping elements, thus forming an activated heavily-doped source and an activated heavily-doped drain in the Ge layer or the SiGe layer with high Ge content.

In one embodiment, both the source and the drain are formed by the low-temperature selective epitaxy process and are in-situ doped in the process. However, it should be noted that only the source or only the drain may be formed by the low-temperature selective epitaxy process, and a remaining drain or source may be formed according to other known methods, which should also fall within the scope of the present disclosure.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A method for forming a MOS transistor structure with an in-situ doped source and drain, comprising steps of:
    providing a substrate;
    forming a first Ge content layer on the substrate;
    forming a first strained SiGe layer with Ge content lower than that of the first Ge content layer on the first Ge content layer;
    forming a gate stack on the first strained SiGe layer and forming a side wall of one or more layers on both sides of the gate stack;
    etching the first strained SiGe layer and the first Ge content layer to form a source region and a drain region; and
    forming a source and a drain in the source region and the drain region respectively by a low-temperature selective epitaxy, and introducing a doping gas during the low-temperature selective epitaxy to heavily dope the source and the drain and to in-situ activate a doping element.

2. The method according to claim 1, wherein the first Ge content layer comprises a strained or non-strained Ge layer or a strained or non-strained SiGe layer.

3. The method according to claim 2, before forming the source and the drain in the source region and the drain region respectively, further comprising a step of:
    forming at least a second strained Si layer or a second strained SiGe layer with Ge content lower than that of the first Ge content layer on bottoms of the source region and the drain region.

4. The method according to claim 2, before forming the first Ge content layer on the substrate, further comprising:
    forming a third strained Si layer or a third strained SiGe layer with Ge content lower than that of the first Ge content layer on the substrate, in which the first Ge content layer is formed on the third strained Si layer or on the third strained SiGe layer, and when etching the first Ge content layer to form a source region and a drain region, the third strained Si layer or the third strained SiGe layer is used as a stop layer.

5. The method according to claim 1, wherein the source and the drain are formed in the source region and the drain region respectively by a low-temperature reduced pressure chemical vapor deposition and a selective epitaxy, or by an ultra-high vacuum chemical vapor deposition and a selective epitaxy.

6. The method according to claim 5, wherein the low-temperature reduced pressure chemical vapor deposition is performed at a temperature ranging between 300° C. and 600° C.

7. The method according to claim 5, wherein the ultra-high vacuum chemical vapor deposition is performed at a temperature ranging between 200° C. and 600° C.

8. The method according to claim 1, wherein a precursor for epitaxy comprises $GeH_4$ or a gas mixture of $SiH_4$ and $GeH_4$.

9. The method according to claim 8, wherein the doping gas comprises $AsH_3$, $PH_3$ or $BH_3$.

10. The method according to claim 1, further comprising:
    after forming the source and the drain in the source region and the drain region respectively by the low-temperature selective epitaxy, forming a fourth strained Si layer or a fourth strained SiGe layer with Ge content lower than that of the first Ge content layer on the source and the drain respectively.

* * * * *